United States Patent
Jung et al.

(10) Patent No.: US 10,186,653 B2
(45) Date of Patent: Jan. 22, 2019

(54) VIBRATOR EQUIPPED WITH PIEZOELECTRIC ELEMENT

(71) Applicant: G2HYSONIC CO., LTD., Ansan-si (KR)

(72) Inventors: He Won Jung, Ansan-si (KR); Jong Sik Seo, Ansan-si (KR); Se Jun Chun, Ansan-si (KR); Min Gi Kim, Ansan-si (KR)

(73) Assignee: G2HYSONIC CO., LTD., Ansan-si (KR)

( * ) Notice: Subject to any disclaimer, the term of this patent is extended or adjusted under 35 U.S.C. 154(b) by 444 days.

(21) Appl. No.: 15/009,949

(22) Filed: Jan. 29, 2016

(65) Prior Publication Data

US 2016/0144403 A1    May 26, 2016

Related U.S. Application Data

(62) Division of application No. 13/983,124, filed as application No. PCT/KR2012/007654 on Sep. 24, 2012, now Pat. No. 9,590,166.

(30) Foreign Application Priority Data

Oct. 6, 2011 (KR) .................. 10-2011-0101601
Apr. 12, 2012 (KR) .................. 10-2012-0038057
Apr. 12, 2012 (KR) .................. 10-2012-0038058

(51) Int. Cl.
  *H01L 41/053*   (2006.01)
  *H01L 41/09*    (2006.01)
  (Continued)

(52) U.S. Cl.
  CPC ........ *H01L 41/0926* (2013.01); *B06B 1/0603* (2013.01); *B06B 1/10* (2013.01); *H01L 41/053* (2013.01); *H01L 41/0933* (2013.01)

(58) Field of Classification Search
  CPC .............. H01L 41/0926; H01L 41/053; H01L 41/0933; B06B 1/0603; B06B 1/10
  (Continued)

(56) References Cited

U.S. PATENT DOCUMENTS 3,360,664 A * 12/1967 Straube ................. B06B 1/0603
                                                        307/400
4,364,259 A * 12/1982 Muranaka ............. G01L 23/222
                                                        310/312

(Continued)

FOREIGN PATENT DOCUMENTS

| JP | 63157682 A | * | 6/1988 | ............... H02N 2/00 |
| JP | 63157683 A | * | 6/1988 | ............... H02N 2/00 |
| JP | 02074868 A | * | 3/1990 | ............... G01P 15/09 |

*Primary Examiner* — Thomas Dougherty
(74) *Attorney, Agent, or Firm* — Novick, Kim & Lee, PLLC; Jae Youn Kim

(57) ABSTRACT

A vibrator equipped with a piezoelectric element comprises: a case of which an upper or lower surface is coupled to an object to be vibrated; a vibrating part which is disposed in the case; a piezoelectric element which is coupled to the vibrating part so as to be deformed, thereby vibrating the vibrating part up and down; and a power supply part which supplies power to the piezoelectric element. The vibrating part is formed with a hooking protrusion which is protruded laterally, and the case is formed with a hooking groove which restricts an up/down and lateral moving distance of the hooking protrusion.

6 Claims, 13 Drawing Sheets

(51) Int. Cl.
*B06B 1/06* (2006.01)
*B06B 1/10* (2006.01)

(58) Field of Classification Search
USPC ........................................ 310/328, 340, 348
See application file for complete search history.

(56) References Cited

U.S. PATENT DOCUMENTS

| | | | |
|---|---|---|---|
| 4,542,315 A * | 9/1985 | Yamamoto | H03H 9/0547 |
| | | | 310/319 |
| 5,021,701 A * | 6/1991 | Takahashi | B05B 17/0607 |
| | | | 239/102.2 |
| 2011/0095649 A1 | 4/2011 | Kagayma et al. | |
| 2012/0212100 A1 | 8/2012 | Lee | |
| 2016/0030978 A1* | 2/2016 | Moon | B06B 1/0603 |
| | | | 310/323.01 |

* cited by examiner

A–A (a)

(b)

(c)

(a)

(b)

(c)

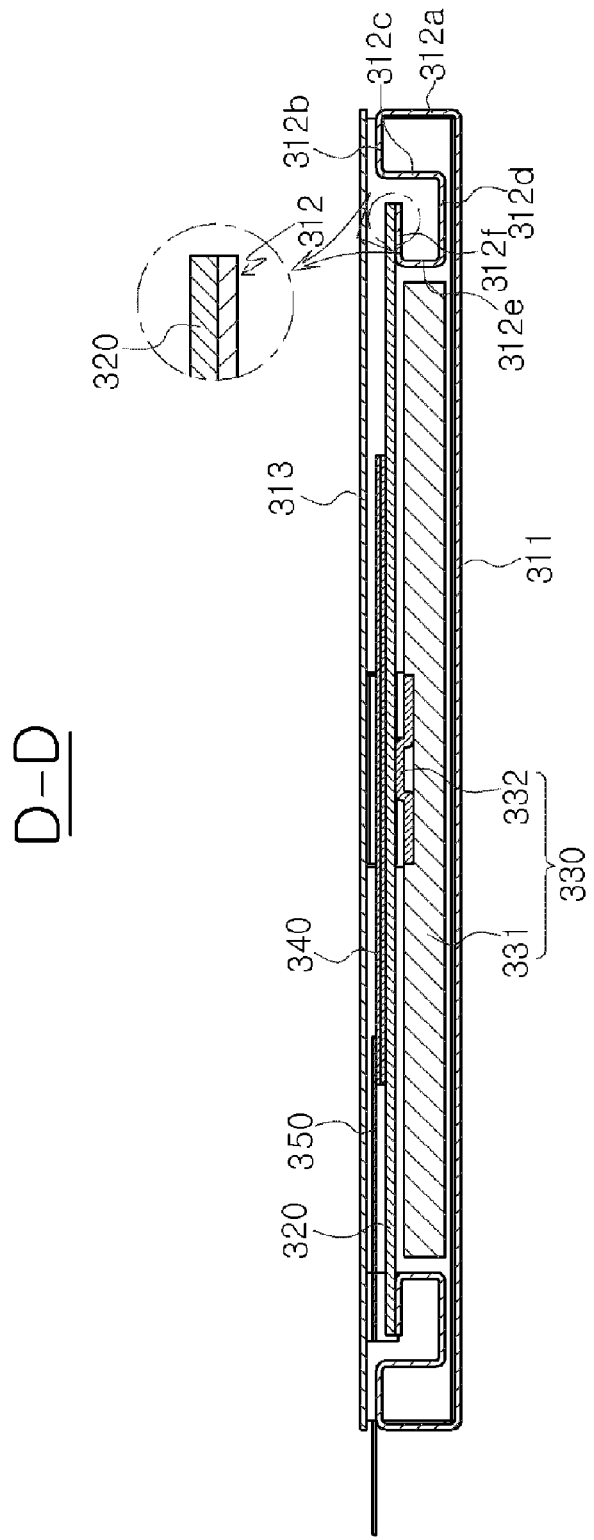

VIBRATOR EQUIPPED WITH PIEZOELECTRIC ELEMENT

CROSS REFERENCE TO RELATED APPLICATIONS

This application is a divisional application of U.S. Ser. No. 13/983,124, filed on Aug. 1, 2013, which is a national entry of PCT Application No. PCT/KR2012/007654 filed on Sep. 24, 2012, which claims priority to and the benefit of Korean Application Nos. 10-2012-0038058 filed on Apr. 12, 2012, 10-2012-0038057 filed on Apr. 12, 2012 and 10-2011-0101601 filed on Oct. 6, 2011, in the Korean Patent Office, the entire contents of which are incorporated herein by reference.

TECHNICAL FIELD

The present invention relates to a vibrator equipped with a piezoelectric element, and more particularly, to a vibrator equipped with a piezoelectric element, in which vibration is generated by using bending deformation of the piezoelectric element.

BACKGROUND ART

Recently, a study on realization of haptic feedback through a touch screen or a touch pad of a small mobile terminal has been actively carried out.

A vibrator is mainly used in order to provide the mobile terminal with the haptic feedback. The vibrator employs a solenoid principle.

In the vibrator using a solenoid, magnetic force generated is proportional to the number of coils wound on a bobbin and the intensity of current.

Therefore, the vibrator using the solenoid has a problem in that the enhancement of vibration power due to an increase in the intensity of magnetic force inevitably leads to an increase in its volume or power consumption.

Thus, it is required to develop a new vibrator which can increase the vibration power, can be small and also can have low power consumption.

Further, in a conventional vibrator, for example, as described in Korean Patent Laid-Open No. 2001-0108361 in which a piezoelectric element is coupled to a flat vibrating plate supported by a spring, an elongated vibrating plate is needed to obtain higher vibration. In case that a length of the vibrating plate becomes longer, space expansion is inevitable, and thus there is a disadvantage to a compact electronic unit applied to the vibrating plate.

Furthermore, in Korean Patent No. 10-1016208, there is disclosed a hybrid actuator using a vibrator.

FIG. 1 is a side cross-sectional view of a conventional actuator using a vibrator.

As shown in FIG. 1, the conventional actuator includes a vibrator 11, 12 which generates vibration according to the intensity of power; a lower plate 20 which is disposed at a lower side of the vibrator 11, 12 so as to be spaced apart from the vibrator 11, 12 and also which has its own elastic characteristic; an electromagnetic force generator 30 which is disposed between the vibrator 11, 12 and the lower plate 20 so as to vibrate the lower plate 20 through electromagnetic force generated by electromagnetic induction; and a fixing means 40 which fixes one end of the vibrator 11, 12 and one end of the lower plate 20 so that the vibrator 11, 12 and the lower plate 20 can be vibrated in the state of being spaced apart from each other.

Detailedly, the vibrator 11, 12 is comprised of a vibrating part 11 and a piezoelectric element 12.

The vibrating part 11 is a plate type elastic member which can be vibrated upward and downward.

The piezoelectric element 12 is a piezo-actuator which is longitudinally expanded or contracted according to the intensity of power supplied.

The piezoelectric element 12 is installed at one side of the vibrating part 11 so as to be expanded or contracted, thereby vibrating the vibrating part 11 up and down.

However, in the conventional actuator using the vibrator 11, 12, if a strong impact is applied thereto due to various factors such as user's carelessness and falling test, there is a problem in that the vibrating part 11 exceeds the elastic limit and is plastic=deformed, thereby being in the inoperable status.

SUMMARY OF THE INVENTION

An object of the present invention is to provide a vibrator equipped with a piezoelectric element, which can be small and also can have low power consumption, while increasing vibration power.

Another object of the present invention is to provide a vibrator equipped with a piezoelectric element, which takes up a small space and thus has a small size, while increasing vibration power.

Yet another object of the present invention is to provide a vibrator equipped with a piezoelectric element, which can prevent plastic deformation of the vibrating plate even when an external strong impact is applied, while increasing vibration power.

To achieve the object of the present invention, the present invention can provide a vibrator equipped with a piezoelectric element, including a vibrating member which is formed into a flat type and of which both ends are coupled to an object; a piezoelectric element which is coupled to an upper or lower surface of the vibrating member; and a power supply part which supplies power to the piezoelectric element, wherein the vibrating member includes an operating part including a first operating surface which is disposed horizontally and a second operating surface which is bent down and extended from both ends of the first operating surface; and a fixing part which is extended from the both ends of the operating so as to be coupled to the object, and the piezoelectric element is surface-contacted and coupled to the first operating surface so as to be deformed when power is supplied from the power supply part, such that the operating part is deformed and up/down vibration is generated.

Preferably, the operating part further includes a third operating surface of which one end is bent and extended horizontally from the second operating surface toward an inside portion of the operating part and the other end is extended and coupled to the fixing part.

Preferably, each fixing part includes an inner fixing piece which is parallelly extended from the third operating surface and an outer fixing piece which is bent upward from one side of the inner fixing piece to an outside, and the outer fixing piece is coupled to the object.

Preferably, the vibrator further includes a fastening member which couples the outer fixing piece and the object, and the outer fixing piece is extended toward the second operating surface, and the fastening member couples the outer fixing piece and the object between the second operating surface and the inner fixing piece.

Preferably, a length of the first operating surface is longer than that of each of the second and third operating surfaces, and a width of each of the second and third operating surfaces is wider than that of the first operating surface.

Preferably, a weight body is coupled to a lower side of the first operating surface. More detailedly, weight body coupling plates are provided at both sides of the first operating surface, and a weight body is fitted between the weight body coupling plates so as to be spaced apart from a lower surface of the first operating surface. Herein, a coupling groove is preferably formed at a side surface of the weight body so as to be corresponding to the weight body coupling plate.

Preferably, the third operating surface is spaced apart from the object so as to be moved up and down. More detailedly, the vibrator further includes a base member which is disposed at a lower side of the vibrating member so as to couple the vibrating member to the object, and the base member is formed with a vertical fixing piece which is formed at a position corresponding to the outer fixing piece of the fixing part, and the outer fixing piece is coupled to the vertical fixing piece so that the third operating surface is spaced apart from an upper surface of the base member.

Preferably, the vibrator further includes a control part which controls the power supply part in order to control the power supplied to the piezoelectric element, and the piezoelectric element is deformed by the power applied by the control part, thereby generating vibration of the vibrating member. For example, a voltage applied to the piezoelectric element may have various waveforms such as a sine wave, a triangular wave and a square wave.

Preferably, a frequency of a voltage applied to the piezoelectric element is a resonant frequency which is coincided with a natural frequency of the vibrating member.

Further, the present invention provides a vibrator equipped with a piezoelectric element, including a case of which an upper or lower surface is coupled to an object to be vibrated; a vibrating part which is disposed in the case; a piezoelectric element which is coupled to the vibrating part so as to be deformed, thereby vibrating the vibrating part up and down; and a power supply part which supplies power to the piezoelectric element, wherein the vibrating part is formed with a hooking protrusion which is protruded laterally, and the case is formed with a hooking groove which restricts an up/down and lateral moving distance of the hooking protrusion.

Preferably, the hooking groove is formed in a side surface of the case so that the hooking protrusion is inserted therein, and an up/down spacing distance of the hooking groove is larger than an up/down thickness of the hooking protrusion, and the hooking protrusion is contacted with an upper or lower surface of the hooking groove so that up/down and lateral movement thereof is restricted.

Preferably, the vibrating part includes a vibrating plate which is formed into a flat plate type and of which both ends are bent downward so as to be coupled to the case and on which the piezoelectric element is disposed so as to vibrate the vibrating plate; and a weight body from which the hooking protrusion is protruded and which is coupled to a lower side of the vibrating plate so as to be vibrated together with the vibrating plate, and deformation of the piezoelectric element is restricted by the hooking protrusion.

Preferably, the weight body includes a weight part and a connector which couples the weight part and the vibrating plate, and the hooking protrusion is integrally formed with the connector, and the weight part is formed of tungsten.

Preferably, the piezoelectric element is divided into two parts and disposed on the vibrating plate, and the two piezoelectric elements are arranged to be mutually spaced apart from a center portion of the vibrating plate.

Preferably, the vibrator further includes a first damper which is coupled to an upper portion of the vibrating plate and disposed between the two piezoelectric elements; and a second damper which is coupled to a lower portion of the weight body.

Further, the present invention provides a vibrator equipped with a piezoelectric element, including a case of which an upper or lower surface is coupled to an object to be vibrated; a vibrating part which is disposed in the case; a piezoelectric element which is coupled to the vibrating part so as to be deformed, thereby vibrating the vibrating part up and down; and a power supply part which supplies power to the piezoelectric element, wherein the case includes a base; and a support part which is protruded from both sides of the base and also coupled to both sides of the vibrating plate so as to elastically support the vibrating plate upward and downward, and a deformation quantity of the vibrating plate which is deformed to be bent by external impact is reduced while the support part is deformed together.

Preferably, a thickness of the support part is thinner than that of the vibrating plate.

Preferably, the support part is protruded from both ends of the base in an inward direction that the vibrating plate is disposed, and the support part is bent a few times so as to elastically support the vibrating plate upward.

Preferably, the support part includes a vertical part which is vertical to the base; and a horizontal part which is extended from the vertical part and spaced apart from a lower surface of the base so as to be parallel with the base, and the vertical part and horizontal part are repeatedly extended and coupled to the vibrating plate.

Preferably, the vibrator further includes a weight body which is coupled to a lower side of the vibrating plate so as to be vibrated together with the vibrating plate, and the weight body is formed with a hooking protrusion which is protruded laterally, and the case is formed with a hooking groove which restricts an up/down moving distance of the hooking protrusion.

The vibrator equipped with the piezoelectric element of the present invention has effects, as follows:

While the vibration member in which the vibration is substantially generated has a long length in order to generate the more enhanced vibration, the space occupied by the electronic unit is reduced, and also while the vibration power is increased, the power consumption is small, and thus it advantageous to reduce a size of the electronic unit.

Since the vibrating part to which the piezoelectric element is coupled is formed with the hooking protrusion so as to restrict the up/down and lateral moving distance thereof, it is possible to prevent the excessive deformation and plastic deformation of the vibrating part when the strong external impact is exerted, thereby improving the impact resistance.

Further, since the vibrating part to which the piezoelectric element is coupled is formed with the hooking protrusion so as to restrict the up/down and lateral moving distance thereof, the excessive deformation of the piezoelectric element is restricted and thus the damage thereof is also prevented.

And since the weight body formed of tungsten having a large specific gravity is coupled to the lower portion of the vibrating plate, it is possible to be coincided with the resonant frequency of the vibrating part, thereby reducing the power consumption and increasing the vibration power.

Further, since the two piezoelectric elements are arranged to be mutually spaced apart from the center portion of the vibrating plate, it is prevented that the piezoelectric element is excessively deformed by the center portion of the vibrating plate in which the maximum deformation is occurred.

Further, since the first and second dampers are coupled to the upper side of the vibrating part and the lower side of the weight part so as to be contacted with the base and cover when the vibrating part is vibrated, it is possible to absorb and reduce the impact generated when the vibrating part is vibrated.

Further, since the vibrating plate is elastically supported by the support part protruded from the base so that the support part is deformed together with the vibrating plate so as to reduce the bending deformation of the vibrating plate when the external impact is generated, it is prevented that the vibrating plate is excessively deformed and thus plastic-deformed by the strong external impact, thereby improving impact resistance.

Further, since the support part is thinner than the vibrating plate so as to be more deformed when the strong external impact, such that the vibrating plate is vibrated up and down, it is possible to prevent the excessive deformation of the vibrating plate and the damage of the piezoelectric element.

Further, since the weight part from which the hooking protrusion is formed is coupled to the vibrating plate in which the piezoelectric element is coupled and thus the up/down moving distance of the vibrating plate is restricted, the excessive deformation of the piezoelectric element is restricted and thus the damage of the piezoelectric element is prevented.

DESCRIPTION OF DRAWINGS

The above and other objects, features and advantages of the present invention will become apparent from the following description of preferred embodiments given in conjunction with the accompanying drawings, in which:

FIG. 14 is a cross-sectional view taken along a line E-E of FIG. 2.

DETAILED DESCRIPTION OF THE INVENTION

Hereinafter, the embodiments of the present invention will be described in detail with reference to accompanying drawings.

First Embodiment

Figure 1:
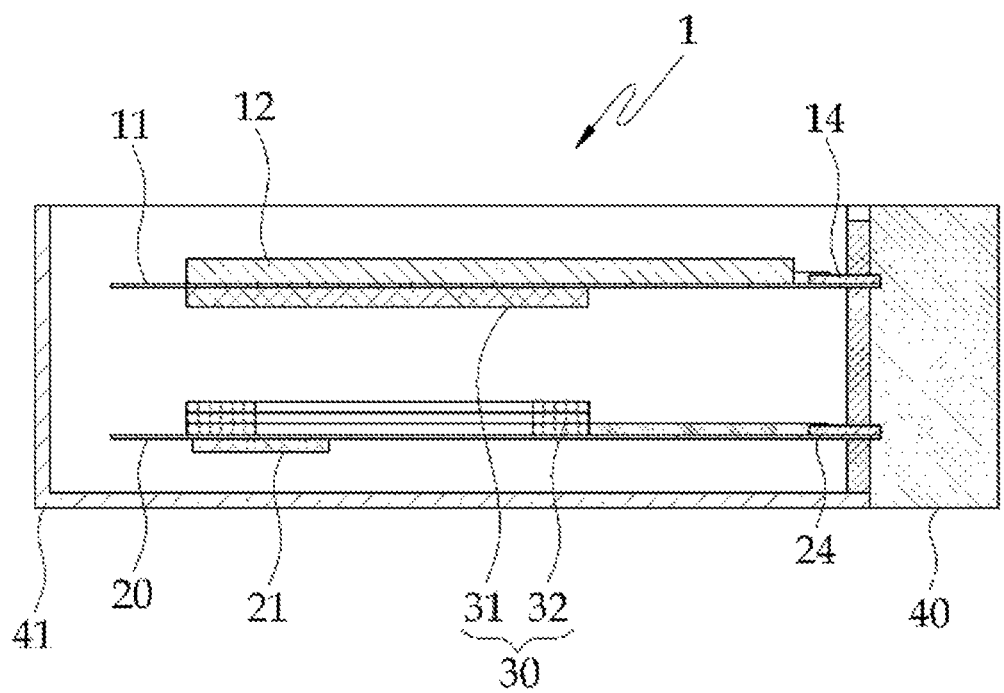
FIG. 1 is a side cross-sectional view of a conventional actuator using a vibrator.
Figure 2:
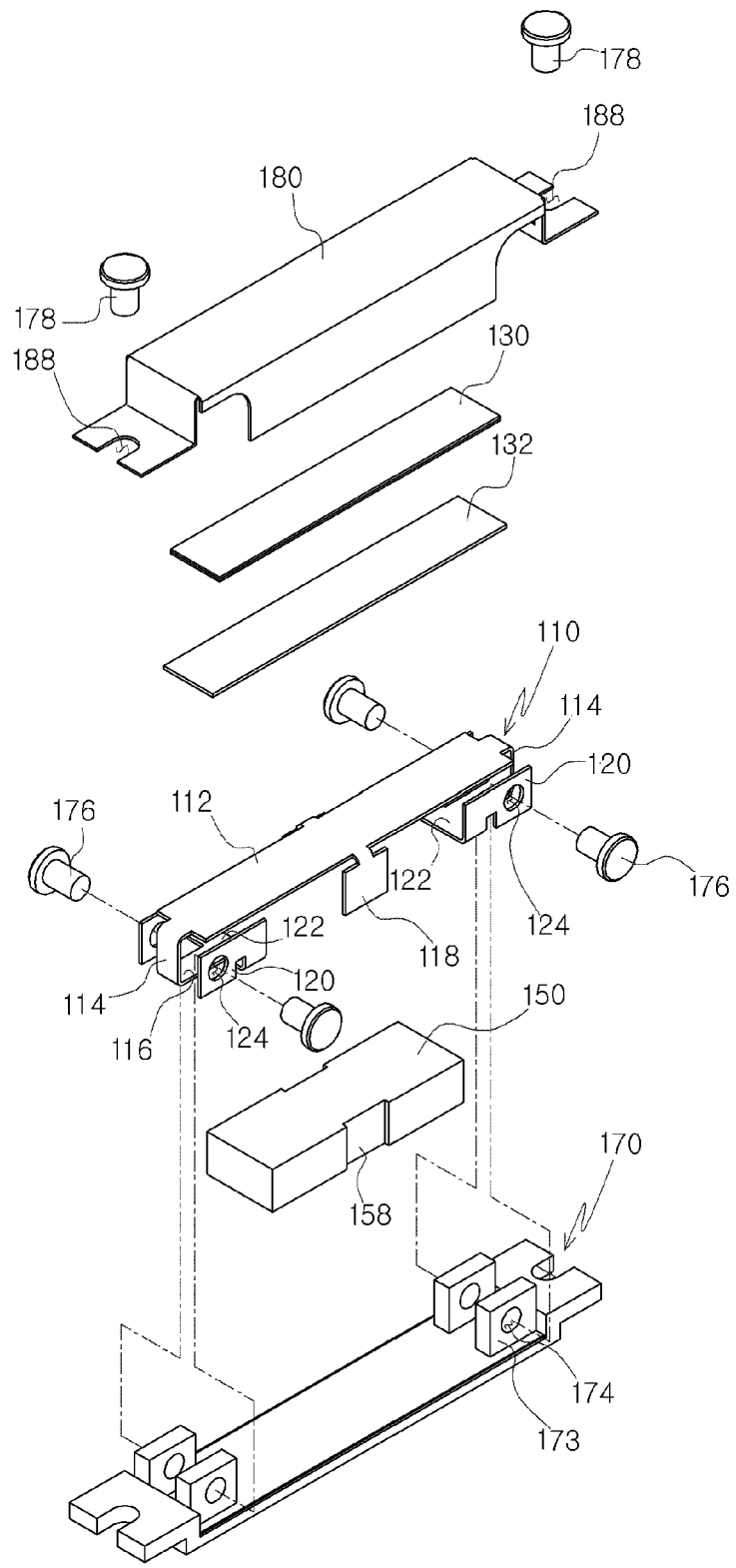
FIG. 2 is an exploded perspective view of a vibrator according to a first embodiment of the present invention.
Figure 3:
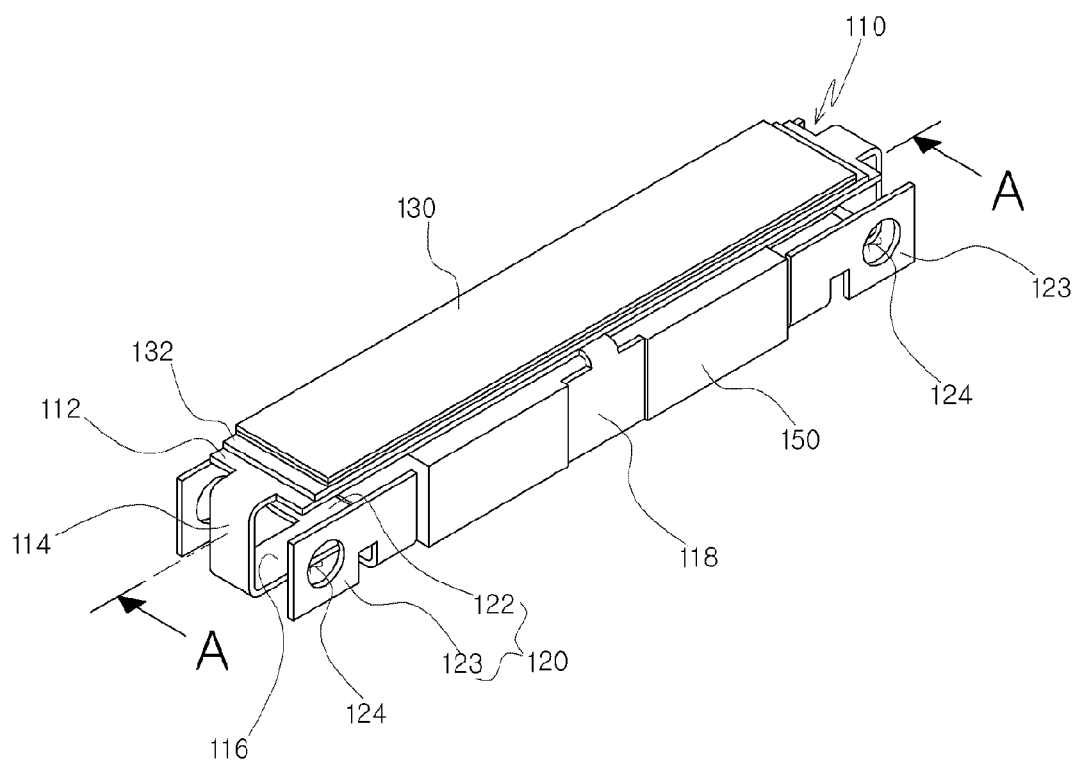
FIG. 3 is a perspective view showing the status that a vibrating member, a piezoelectric element and a weight body are coupled in the vibrator according to the first embodiment of the present invention.
Figure 4:
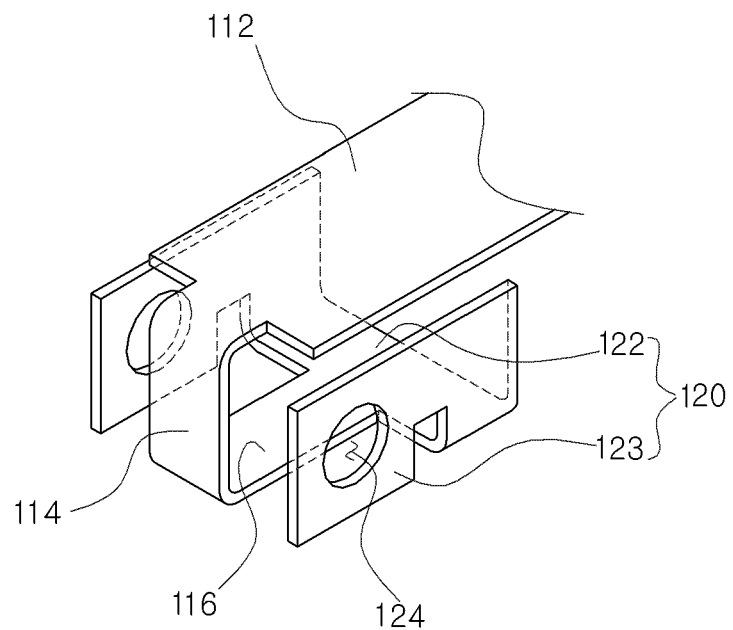
FIG. 4 is a view showing a part of a vibrating member applied to the vibrator according to the first embodiment of the present invention.
Figure 5:
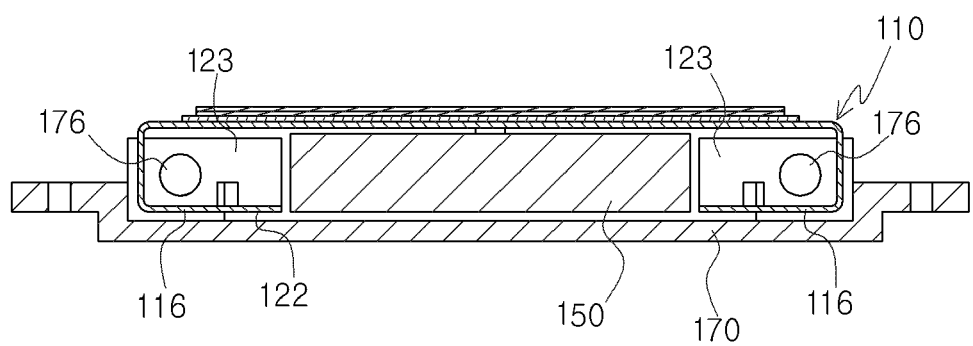
FIG. 5 is a longitudinal cross-sectional view showing the status that a base member is coupled to the configuration of FIG. 2.

FIG. 2 is an exploded perspective view of a vibrator according to a first embodiment of the present invention, FIG. 3 is a perspective view showing the status that a vibrating member, a piezoelectric element and a weight body are coupled in the vibrator according to the first embodiment of the present invention, FIG. 4 is a view showing a part of a vibrating member applied to the vibrator according to the first embodiment of the present invention, and FIG. 5 is a longitudinal cross-sectional view showing the status that a base member is coupled to the configuration of FIG. 2.

As shown in FIG. 2, a vibrator according to the present invention may include a vibrating member 110, a piezoelectric element 130, a power supply part (not shown), a weight body 150, a base member 170 and a cover member 180, or may include only part of them. Hereinafter, the present invention will be described on the basis of the vibrator shown in FIG. 2. Herein, the cover member 180 is not an essential element forming the vibrator but just a casing element for forming an appearance of the vibrator.

Referring to FIGS. 2 to 4, a vibrator according to the first embodiment of the present invention includes a vibrating member 110, a piezoelectric element 130, a power supply part (not shown), a weight body 150 and a base member 170.

The vibrating member 110 includes an operating part 112, 114, 116 and a fixing part 120. One end 116 of the operating part 112, 114, 116 is coupled to one end 122 of the fixing part 120, as described later.

The operating part 112, 114, 116 of the vibrating member 110 includes a first operating surface 112 which is disposed horizontally, a second operating surface 114 which is bent down and extended from both ends of the first operating surface 112 and a third operating surface 116 which is bent and extended horizontally from the second operating surface 114 toward an inside portion of the operating part 112, 114, 116. The vibrating member 110 or the operating part 112, 114, 116 has to be formed of a proper material which can be bent together with bending deformation of the piezoelectric element 130 or has to have a proper thickness which can be bent together with the bending deformation of the piezoelectric element 130. The proper material and thickness may be appropriately selected by a person skilled in the art.

As shown in drawings, the piezoelectric element 130 is adhered on an upper surface of the first operating surface 112 through an adhesive layer 132 formed of an adhesive. In the first embodiment, the piezoelectric element 130 is adhered on the upper surface of the first operating surface 112, but may be adhered on a lower surface thereof. Further, the piezoelectric element 130 may be coupled to one of the second and third operating surface 114 and 116 or both of them.

When power is applied to the piezoelectric element 130, the piezoelectric element 130 is bent, and the first operating surface 112 on which the piezoelectric element 130 is adhered is also bent together with the bending deformation of the piezoelectric element 130.

Thus, the second operating surface 114 extended from the first operating surface 112 and the third operating surface 116 extended from the second operating surface 114 are also bent in turn, thereby vibrating the vibrating member 110. The vibration of the operating part 112, 114, 116 is transferred to the base member 170 through the fixing part 120 and then finally transferred to an object to be vibrated. In the first embodiment, the fixing part 120 and the base member 170 are separately provided and coupled to each other by a fastening member 176. However, the one end 116 of the operating part 112, 114, 116 may be directly coupled to the object to be vibrated without the fixing part 120 and base member 170. In this case, a lower space in which the third operating surface of the operating part 112, 114, 116 can be vibrated up and down without any trouble is needed. This will be described later with reference to FIG. 5. Since the piezoelectric element 130 used in this invention is already well known in the art, the detailed description will be omitted. Although not shown, the power supply part is electrically connected to the piezoelectric element 130.

As shown in drawings, the first operating surface 112 is formed to be longer than the second operating surface 114 and/or the third operating surface 116. In this connection, when the piezoelectric element 130 coupled to the first operating surface 112 is bent, the first operating surface 112 is also bent together, as described above. Herein, if a length of the first operating surface 112 becomes longer, a width of the bending deformation of the first operating surface 112 becomes larger, and thus the vibration is also increased.

Both ends of the operation part 112, 114, 116, i.e., the third operating surface 116 is formed with each fixing part 120 to which the base member 170 is coupled.

As shown in drawings, each fixing part 120 includes an inner fixing piece 122 which is parallelly extended from the third operating surface 116 and an outer fixing piece 123 which is bent upward from one side of the inner fixing piece 122 to an outside.

An outside part of the outer fixing piece 123, i.e., a part between the second operating surface 114 and the inner fixing piece 122, which is extended toward the second operating surface 114, is coupled to the base member 170 through the fastening member. In case that the base member 170 is coupled through an inside part of the outer fixing piece 123, there is high possibility that the first and third operating surfaces 112 and 116 of the vibrating member 110 are collided with the fastening member 176, and thus the vibration of the vibrating member 110 may be restricted. Therefore, in order to ensure reliable vibration of the vibrating member 110, it is preferable that the base member 170 is coupled through the outside part of the outer fixing piece 123.

In order to fix the fixing part 120 to the base member 170, the outer fixing piece 123 is formed with a fixing hole 124, and the base member 170 is formed with a vertical fixing piece 174 having a fixing hole 124. When the outer fixing piece 123 of the vibrating member 110 is coupled to the vertical fixing piece 174 of the base member 170, the third operating surface 116 has to be spaced apart from the base member 170, such that the third operating surface 116 can be freely moved up and down by the bending deformation of the piezoelectric element 130 without any trouble. This is to allow entire parts of the vibrating member 110 from the first operating surface 112 to the third operating surfaces 116 to be vibrated by the bending deformation of the piezoelectric element 130, thereby generating larger vibration in the small space. In the first embodiment, the fixing part 120 is coupled to the base member 170, but as described above, the fixing part 120 may be directly coupled to the object to be vibrated.

The weight body 150 is disposed at a lower side of the first operating surface 112 of the vibrating member 110 so as to be spaced apart from the first operating surface 112. More detailedly, a weight body coupling plate 122 is provided at both sides of the first operating surface 112, and a coupling groove 158 is formed at a side surface of the weight body 150 corresponding to the weight body coupling plate 122 so that the weight body coupling plate 122 can be inserted into the coupling groove 158. The weight body 150 is coupled to the sides of the first operating surface 112 by inserting the weight body coupling plate 122 provided at both sides of the first operating surface 112 into the coupling groove 158. The weight body 150 functions to increase the vibration quantity of the vibrating member 110. The reason why the weight body 150 is disposed to be spaced apart from the first operating surface 112 is to prevent an upper edge of the weight body 150 from being contacted with the first operating surface 112 when the first operating surface 112 is deformed upward by the piezoelectric element 130, thereby allowing the vibrating member 110 to be freely vibrated.

After the vibrating member 110 on which the piezoelectric element 130 is disposed is coupled to the base member 170, the cover member 180 is coupled to the base member 170. In order to couple the cover member and the base member 170, both ends of the base member 170 and both ends of the cover member 180 corresponding to the both ends of the base member 170 are respectively formed with a coupling groove 188. And the fastening member 176 is inserted into the coupling groove 188, and thus the cover member 180 is finally installed at the base member 170.

Figure 6:
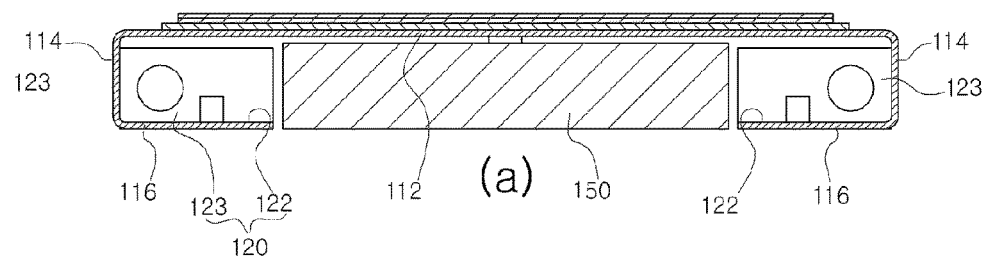
FIG. 6 is a cross-sectional view taken along a line A-A, wherein (a) of FIG. 6 is a view showing the status before operation, (b) of FIG. 6 is a view showing that the vibrating member is vibrated upward and (c) of FIG. 6 is a view showing that the vibrating member is vibrated downward.
Figure 6:
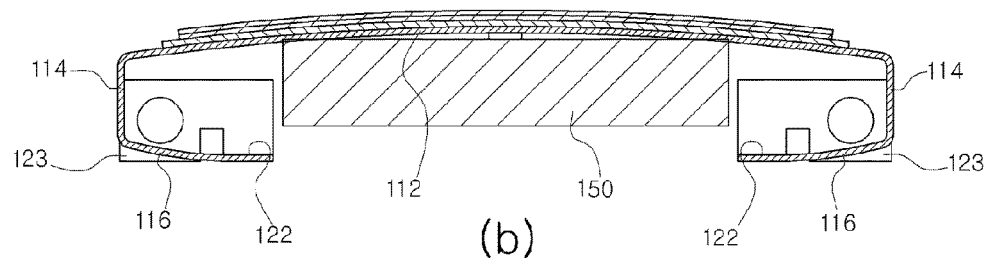
Figure 6:
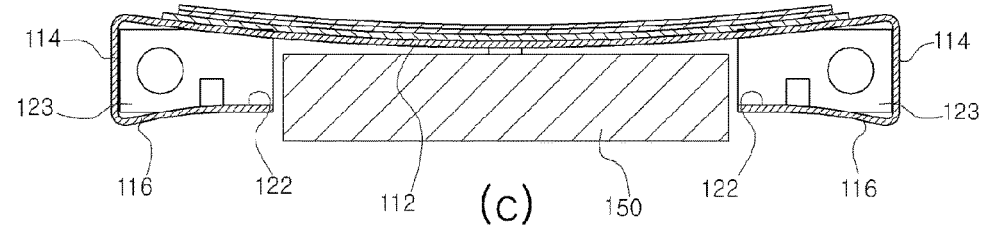

FIG. 6 is a cross-sectional view taken along a line A-A, wherein (a) of FIG. 6 is a view showing the status before operation, (b) of FIG. 6 is a view showing that the vibrating member is vibrated upward and (c) of FIG. 6 is a view showing that the vibrating member is vibrated downward.

In the vibrator having the configuration according to the first embodiment of the present invention, when power is not supplied to the piezoelectric element 130, the vibrating member 110 is maintained without any deformation, as shown in (a) of FIG. 6, and when power is supplied to the piezoelectric element 130, the vibrating member 110 is deformed together with the bending deformation of the piezoelectric element 130 so as to be moved up and down, as shown in (b) and (c) of FIG. 6.

Herein, when the vibrating member 110 is moved upward, the first operating surface 112 is moved upward, the second operating surface 114 is moved inwardly and the third operating surface 116 is moved upward at the same time, as shown in (b) of FIG. 6. And when the vibrating member 110 is moved downward, the first operating surface 112 is moved downward, the second operating surface 114 is moved outwardly and the third operating surface 116 is moved downward at the same time, as shown in (c) of FIG. 6. That is, in the configuration according to the present invention, the vibration of the vibrating member 110 is occurred over all of the first, second and third operating surfaces 112, 114 and 116, but it needs only a small space as compared with when the first, second and third operating surfaces 112, 114 and 116 are arranged straightly.

Herein, as described above, a lower surface of the third operating surface 116 is sufficiently spaced apart from the base member 170 or the object to be vibrated, and thus the up and down movement of the vibrating member 110 is not limited (referring to FIG. 6). Further, the first operating surface 112 is also sufficiently spaced apart from the weight body 150 so that the up and down movement of the vibrating member 110 is not limited (referring to FIG. 5).

Moreover, the present invention may further include a control part (not shown) which controls the power supply part in order to control the power supplied to the piezoelectric element 130.

Herein, a voltage applied to the piezoelectric element 130 may have various waveforms such as a sine wave, a triangular wave and a square wave.

And the voltage applied to the piezoelectric element 130 has a resonant frequency coincided with a natural frequency of the vibrating member 110. Thus, when the power is applied to the piezoelectric element 130, a displacement of the vibrating member 110 is maximized and vibration characteristic thereof is further enhanced, because the voltage frequency applied is coincided with the natural frequency of the vibrating member 110.

Preferably, the voltage frequency applied to the piezoelectric element 130 is 100 to 350 Hz. In other words, since the natural frequency of the vibrating member 110 is 100 to 350 Hz and the voltage frequency applied to the piezoelectric element 130 is also 100 to 350 Hz, the displacement of the vibrating member 110 is increased by the resonant phenomenon.

Second Embodiment

Figure 7:
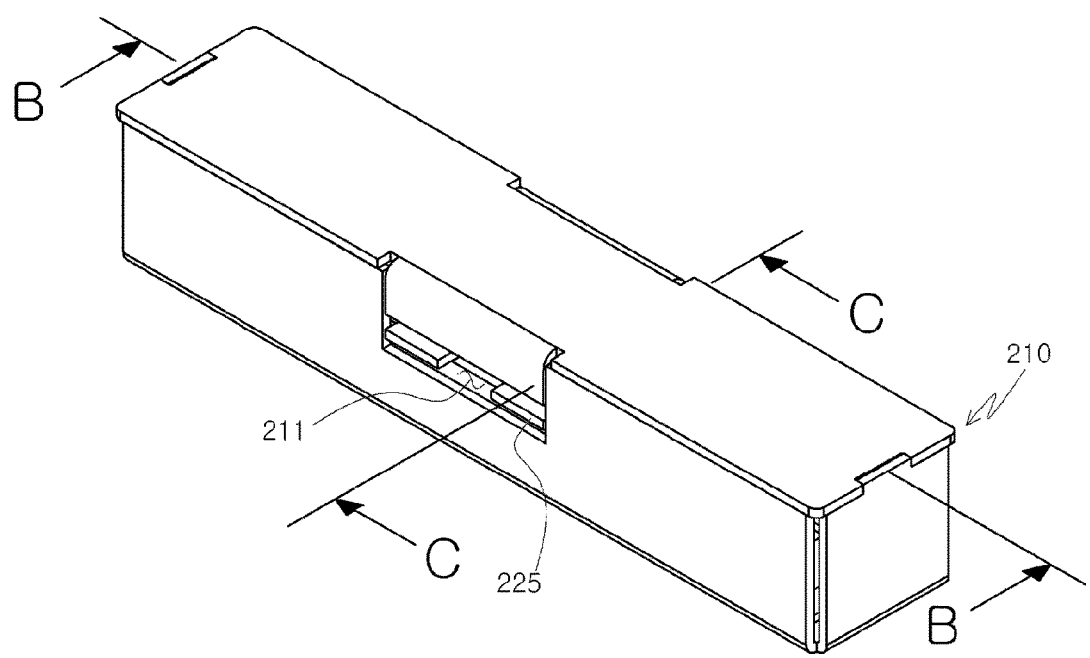
FIG. 7 is a perspective view of a vibrator equipped with a piezoelectric element according to a second embodiment of the present invention.
Figure 8:
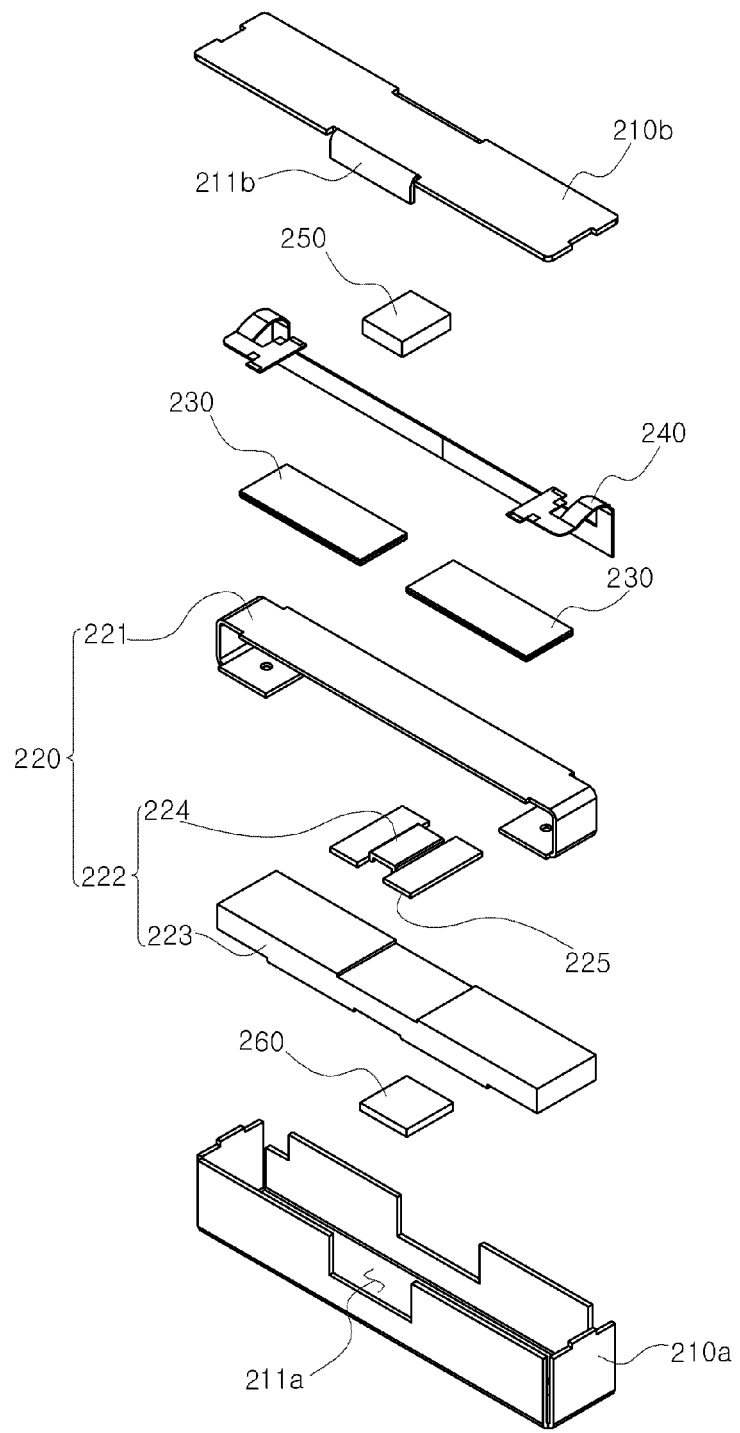
FIG. 8 is an exploded perspective view of the vibrator equipped with the piezoelectric element according to the second embodiment of the present invention.
Figure 9:
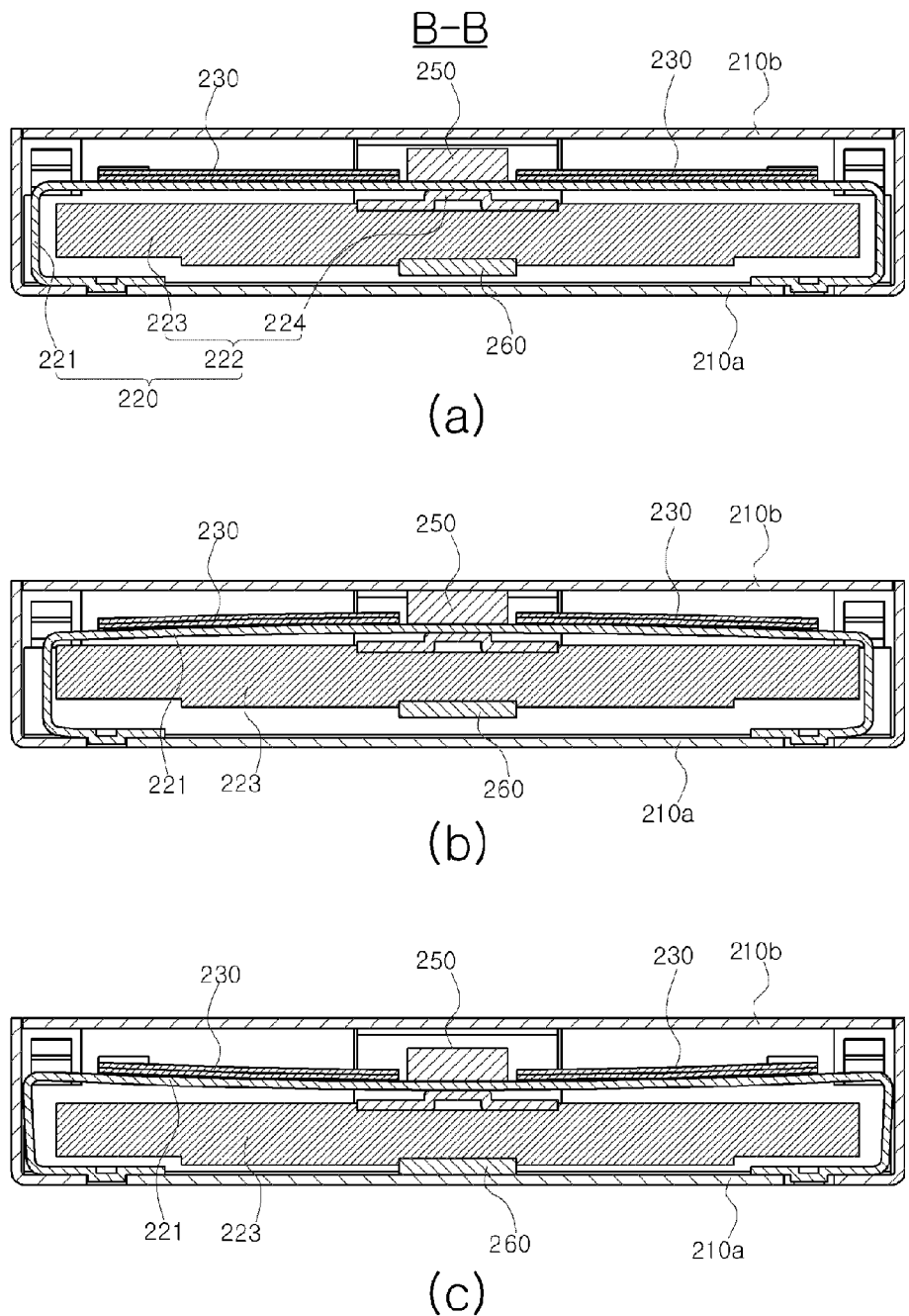
FIG. 9 is a cross-sectional view taken along a line B-B of FIG. 2.
Figure 10:
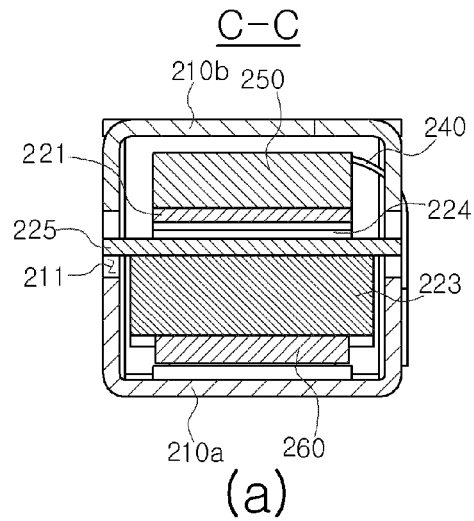
FIG. 10 is a cross-sectional view taken along a line C-C of FIG. 2.
Figure 10:
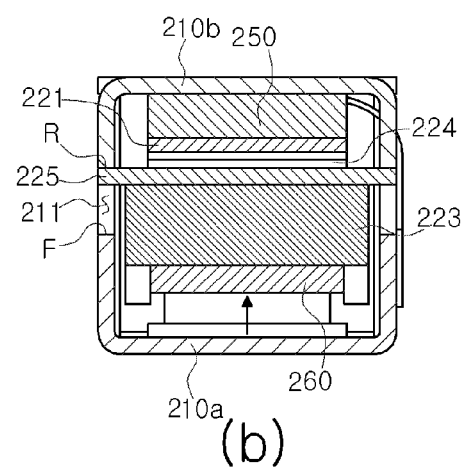
Figure 10:
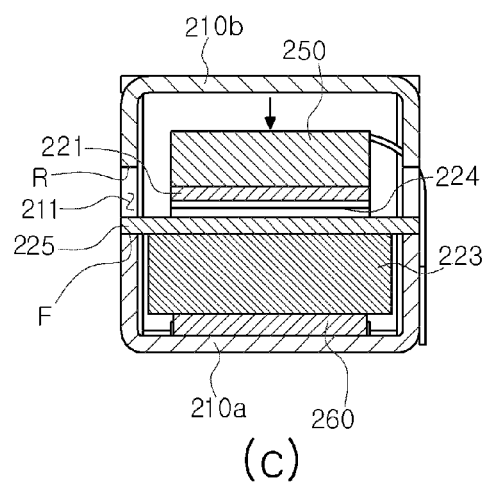

FIG. 7 is a perspective view of a vibrator equipped with a piezoelectric element according to a second embodiment of the present invention, FIG. 8 is an exploded perspective view of the vibrator equipped with the piezoelectric element according to the second embodiment of the present invention, FIG. 9 is a cross-sectional view taken along a line B-B of FIG. 2, and FIG. 10 is a cross-sectional view taken along a line C-C of FIG. 2.

Referring to FIGS. 7 to 10, a vibrating member equipped with a piezoelectric element according to the second embodiment of the present invention includes a case 210, a vibrating part 220, a piezoelectric element 230, a power supply part 240, a first damper 250 and a second damper 260.

An upper or lower surface of the case 210 is coupled to an object to be vibrated. The case 210 includes a base 210a and a cover 210b coupled to the base 210a.

A lower surface of the base 210a is surface-contacted and fixed to the object, and an upper surface thereof is opened so that the vibrating part 220, piezoelectric element 230, power supply part 240, first damper 250 and second damper 260 are disposed therein.

The cover 210b is coupled to the base 210a so as to cover the upper surface of the base 210a.

The case 210 is formed with a hooking groove 211 in order to restrict a up/down and lateral moving distance of a hooking protrusion 225 formed at the vibrating member 220.

Detailedly, as shown in FIGS. 7 and 8, a recessed groove 211a is formed downward at an upper end of a side surface of the base 210a, and the cover 210b is formed with a protrusion 211b which is inserted into the recessed groove 211a formed at the base 210a, and thus the hooking groove 211 is formed between the base 210a and the cover 210b which are coupled to each other.

The hooking protrusion 225 is inserted into the hooking groove 211.

An up/down spacing distance of the hooking groove 211 is longer than an up/down thickness of the hooking protrusion 225 so that the hooking protrusion 225 can be moved up and down, and the up/down and lateral movement of the hooking protrusion 225 is restricted by the hooking groove 211.

The detailed description thereof will be described later together with the hooking protrusion 225.

Meanwhile, the case 210 may be formed with a separate protrusion which is formed inwardly so as to restrict the up/down movement of the hooking protrusion 225 without the hooking groove 211. However, in the second embodiment, the case 210 is formed with the hooking groove 211 so that the hooking protrusion 225 can be inserted therein, and thus it is possible to minimize a whole volume of the case 210.

The vibrating part 220 is disposed in the case 210 and formed with the hooking protrusion 225 which is protruded laterally.

Detailedly, the vibrating part 220 includes a vibrating plate 221 and a weight body 222.

As shown in FIGS. 8 and 9, the vibrating plate 221 is formed into a flat plate type, and both ends of the vibrating plate 221 are bent downward and then bent again so as to be opposed to each other.

That is, the both ends of the vibrating plate 221 are formed into "⌐" shapes of which opened portions are opposed to each other. And the vibrating plate 221 is coupled to the base 210a.

The piezoelectric element 230 is disposed on the vibrating plate 221 so that the vibrating plate 221 can be vibrated by the piezoelectric element 230.

The weight body 222 is disposed at a lower side of the vibrating plate 221 so as to be vibrated together with the vibrating plate 221. The weight body 222 includes a weight part 223 and a connector 224.

The weight part 223 is formed of tungsten and coupled to the lower side of the vibrating through the connector 224.

Tungsten has a specific gravity of 14 to 19.5 which is larger than iron having a specific gravity of 7 to 8 and other metals.

Therefore, since the weight part 223 is formed of tungsten having a large specific gravity, it is possible to increase a mass of the vibrating part 220 without increasing a volume of the weight part 223 and also reduce a volume thereof, even though having the same mass.

If the mass of the weight part 223 is increased, the resonant frequency of the vibrating part 220 becomes small, and thus it is *facile* to increase the vibration power due to the resonant phenomenon when the vibrating part 220 is vibrated by the piezoelectric element 230.

As described above, the connector 224 allows the weight part 223 to be coupled to the vibrating plate 221. The connector 224 is integrally formed with the hooking protrusion 225.

The connector 224 may be integrally formed with the weight part 223 so as to be coupled to the vibrating plate 221, but since it is difficult to machine the weight part 223 formed with tungsten, the connector 224 is formed of a soft material, which can be facilely machined, so as to couple the weight part 223 and the vibrating plate 221.

As described above, the hooking protrusion 225 is formed to be protruded laterally and then inserted into the hooking groove 211. And as shown in FIG. 10, the hooking protrusion 225 is contacted with an upper surface R or a lower surface F of the hooking groove 211 so that the up/down moving distance thereof is restricted.

Further, the hooking protrusion 225 is inserted into the hooking groove 211 so that the lateral movement thereof, i.e., the movement in a longitudinal direction of the vibrating plate 221 is restricted.

And as shown in (a) of FIG. 10, in a state that the power is not applied to the piezoelectric element 230, a distance between the hooking protrusion 225 and the upper surface R of the hooking groove 211 is shorter than a distance between the piezoelectric element 230 and the cover 210b, and a distance between the hooking protrusion 225 and the lower surface F of the hooking groove 211 is shorter than a distance between the weight part 223 and the base 210a.

Since the hooking protrusion 225 is inserted into the hooking groove 211 so that the up/down moving distance is restricted, it is prevented that the vibrating plate 221 is excessively deformed and thus plastic-deformed by strong external impact, thereby improving impact resistance.

Particularly, even in a falling test in which a product is free-fallen in order to perform an impact test of the product, the vibrating plate 221 is not plastic-deformed by the impact but can be normally operated.

Therefore, the present invention has a strong characteristic against the external impact even in an ordinary usage environment such as a mobile terminal equipped with the vibrator as described above.

Furthermore, since the up/down and lateral moving distance of the hooking protrusion 225 is restricted, the excessive deformation of the piezoelectric element 230 coupled to the vibrating part 220 is also restricted, and thus the damage of the piezoelectric element 230 is prevented.

When the external impact is exerted, the piezoelectric element 230 may be excessively deformed by the weight part 223, which is coupled to the vibrating plate 221, so as to exceed an elastic limit thereof, thereby being damaged.

Therefore, as described above, the up/down and lateral moving distance of the vibrating part 220 in which the piezoelectric element 230 is coupled is restricted by the hooking protrusion 225, and thus the excessive deformation of the piezoelectric element 230 is prevented.

The piezoelectric element 230 is coupled to the vibrating part 220 so as to vibrate the vibrating part 220 upward and downward when it is deformed to be bent.

More detailedly, the piezoelectric element 230 is surface-contacted to the vibrating plate 221 and deformed to be bent when the power is applied.

And the vibrating plate 221 is vibrated upward and downward by the bending deformation of the piezoelectric element 230.

Herein, the weight part 223 is also vibrated, and if the vibration frequency generated by the piezoelectric element 230 is coincided with the natural frequency of the vibrating part 220, the vibration power is increased by the resonant phenomenon.

And as described above, since the weight part 223 is formed of tungsten having a larger specific gravity than other materials, it is possible to increase the vibration power or reduce the power consumption.

As the vibration power of the vibrating part 220 is increased, the deformation quantity of the piezoelectric element 230 is also increased.

Therefore, the hooking protrusion 225 which is vibrated together with the vibrating part 220 is inserted into the hooking groove 211 so that the up/down and lateral moving distance thereof is restricted, and thus the deformation quantity of the piezoelectric element 230 is restricted. Therefore, it is prevented that the piezoelectric element 230 is damaged by the excessive deformation.

The piezoelectric element 230 is divided into two parts and then installed on the vibrating plate 221.

As shown in FIG. 9, the two piezoelectric elements 230 are arranged to be mutually spaced apart from a center portion of the vibrating plate 221.

The piezoelectric element 230 may be formed into one body and then installed on the vibrating plate 221. However, since the center portion of the vibrating plate 221 is deformed the most when the vibrating plate 221 is vibrated, the piezoelectric element 230 is disposed to be spaced apart from the center portion of the vibrating plate 221, thereby preventing the damage thereof due to the bending deformation.

The first damper 250 is coupled to an upper side of the vibrating plate 221 and disposed between the two piezoelectric elements 230.

And the second damper 250 is coupled to a lower side of the weight body 222.

As shown in FIG. 10, when the vibrating plate 221 and the weight part 223 are vibrated together, the first and second damper 250 and 260 are firstly collided with the base 210a and the cover 210b so as to absorb impact, thereby absorbing and reducing the impact generated when the vibrating part 220 is vibrated or when the hooking protrusion 225 is collided with the upper surface R and the lower surface F of the hooking groove 211.

Hereinafter, the operating process of the present invention will be described.

(a) of FIG. 9 and (a) of FIG. 10 show an initial state that the power is not yet applied to the piezoelectric element 230, wherein the piezoelectric element 230 and the vibrating part 220 are not deformed.

In such state, if the power is applied to the piezoelectric element 230, the bending deformation of the piezoelectric element 230 is occurred, and the vibrating part 220 is vibrated up and down by the piezoelectric element 230, as shown in (b) and (c) of FIG. 9.

As shown in (b) of FIG. 9, if the piezoelectric element 230 is deformed to be bent upward, the vibrating plate 221 is also deformed together with the piezoelectric element 230, and the vibrating part 220 is moved up.

Herein, as shown in FIG. 10, the first damper 250 is firstly contacted with the cover 210b and then compressed, and the hooking protrusion 225 is contacted with the an upper surface 11a of the hooking groove 211 and thus the upward movement of the vibrating part 220 is restricted.

As shown in (c) of FIG. 9, if the piezoelectric element 230 is deformed to be bent downward, the vibrating plate 221 is deformed together with the bending deformation of the piezoelectric element 230, and the vibrating part 220 is moved down.

Herein, as shown in (c) of FIG. 10, the second damper 260 is firstly contacted with the base 210a, and the hooking protrusion 225 is contacted with a lower surface 11b of the hooking groove 211 and thus the downward movement of the vibrating part 220 is restricted.

As described above, the amplitude of the vibrating part 220 vibrated by the piezoelectric element 230 is maximized by the resonant phenomenon occurred when the vibration frequency of the piezoelectric element 230 is coincided with the natural frequency of the vibrating part 220, and thus the vibration power thereof is also increased.

Therefore, the vibration power of the vibrating part 220 can be increased while the power consumption is reduced, and also it is possible to prevent the plastic deformation of the vibrating plate 221 and the damage of the piezoelectric element 230 due to the strong impact.

Third Embodiment

Figure 11:
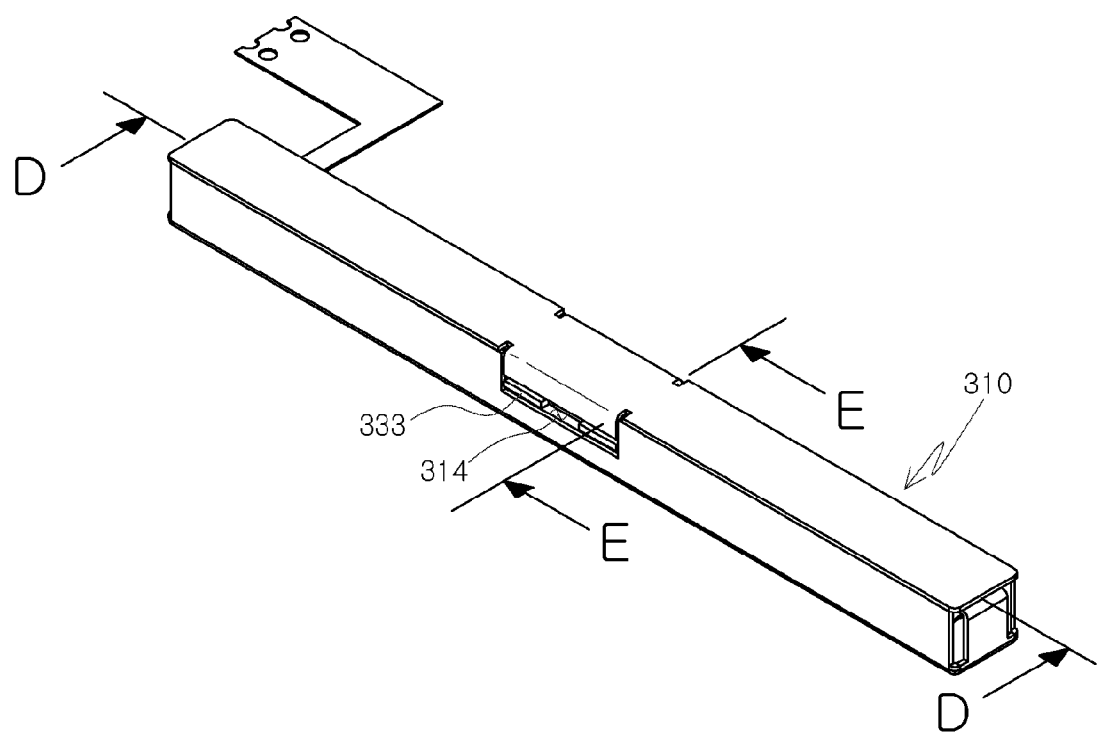
FIG. 11 is perspective view of a vibrator equipped with a piezoelectric element according to a third embodiment of the present invention.
Figure 12:
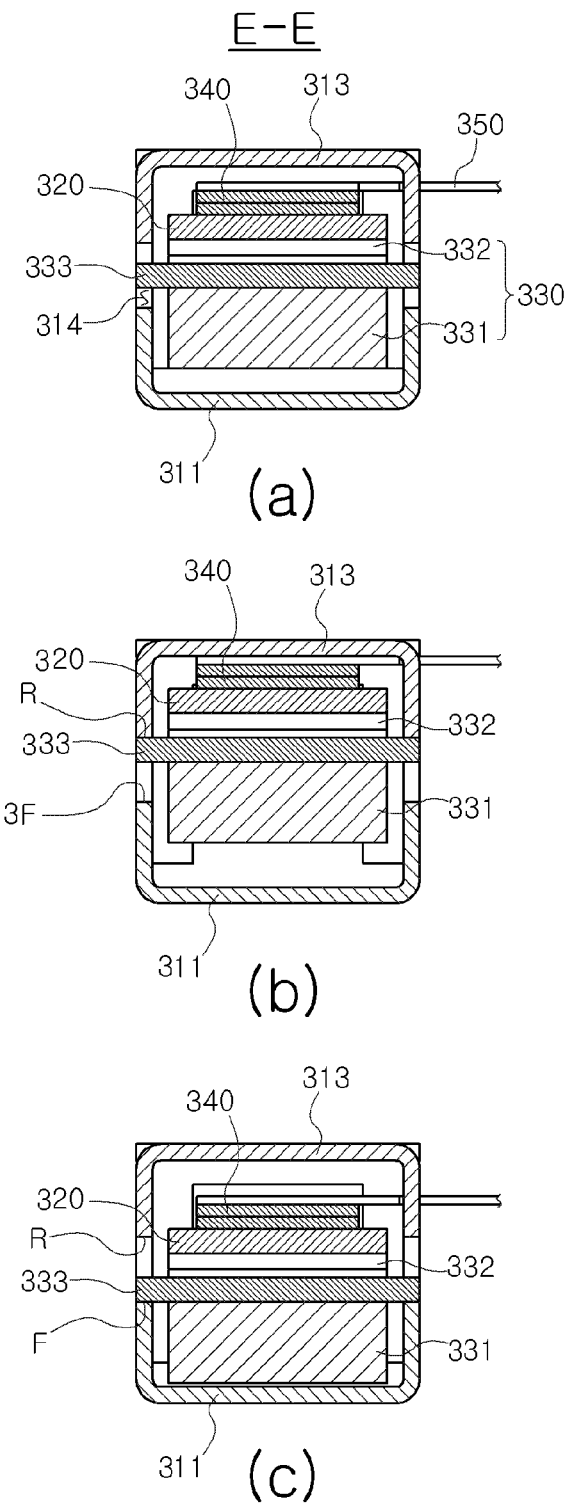
FIG. 12 is an exploded perspective view of the vibrator equipped with the piezoelectric element according to the third embodiment of the present invention.
Figure 13:
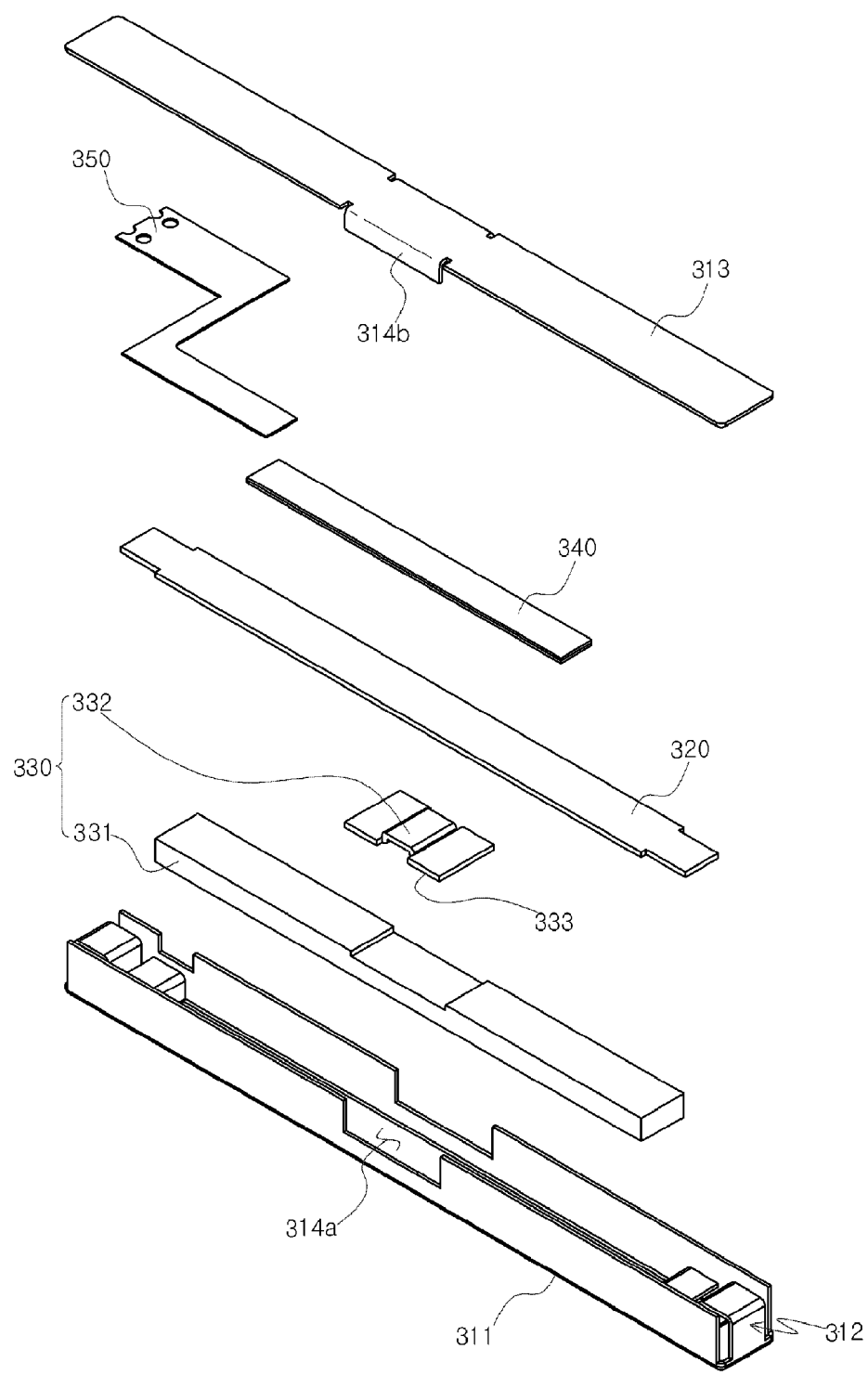
FIG. 13 is a cross-sectional view taken along a line D-D of FIG. 2.

FIG. 11 is perspective view of a vibrator equipped with a piezoelectric element according to a third embodiment of the present invention, FIG. 12 is an exploded perspective view of the vibrator equipped with the piezoelectric element according to the third embodiment of the present invention, FIG. 13 is a cross-sectional view taken along a line D-D of FIG. 2, and FIG. 14 is a cross-sectional view taken along a line E-E of FIG. 2.

FIG. 14 shows the state that a support part is elastically deformed by external impact and a vibrating plate is vibrated up and down.

Referring to FIGS. 11 to 14, a vibrating member equipped with a piezoelectric element according to the third embodiment of the present invention includes a case 310, a vibrating plate 320, a weight body 330, a piezoelectric element 340 and a power supply part 350.

An upper or lower surface of the case 310 is coupled to an object to be vibrated.

As shown in FIGS. 11 and 12, the case 310 includes a base 311, a support part 312 and a cover 313.

The base 311 is surface-contacted and fixed to the object, and an upper surface thereof is opened so that the vibrating plate 320, weight body 330 and piezoelectric element 340 are disposed therein.

The support part 312 is formed to be protruded at both sides of the base 311 and also coupled to both sides of the vibrating plate 320 so as to elastically support the vibrating plate 320 upward and downward.

The support part 312 is protruded from at both ends of the base 311 in an inward direction that the vibrating plate 320 is disposed and then bent a few times. The support part 312 includes a vertical part 312a, 312c, 312e and a horizontal part 312b, 312d, 312f.

The vertical part 312a, 312c, 312e is formed to be vertical to the base 311, and the horizontal part 312b, 312d, 312f is spaced part from a lower surface of the base 311 and disposed to be parallel with the base 311.

Detailedly, as shown in FIG. 13, the support part 312 includes a first vertical part 312a which is protruded from the base 311 so as to be vertical to the base 311, a first horizontal part 312b which is protruded from the first vertical part 312a so as to be parallel with the base 311, a second vertical part 312c which is protruded from the first horizontal part 312b so as to be vertical to the first horizontal part 312b, a second horizontal part 312d which is protruded from the second vertical part 312c so as to be parallel with the base 311, a third vertical part 312e which is protruded from the second horizontal part 312d so as to be vertical to the second horizontal part 312d, and a third horizontal part 312f which is protruded from the third vertical part 312e so as to parallel with the base 311.

The third horizontal part 312f is formed to be bent from the third vertical part 312e toward the second vertical part 312c and then coupled to the vibrating plate 320.

The support part 312 is formed of an elastic material and has a thickness which is thinner than that of the vibrating plate 320.

In other words, the support part 312 is formed to be thinner than the vibrating plate 320, and thus when the vibrating plate 320 is deformed to be bent, the support part 312 is deformed so as to reduce the bending deformation of the vibrating plate 320.

Therefore, when a strong impact is exerted from an outside, the vibrating plate 320 is vibrated together with the support part 312, and thus it is prevented that the vibrating plate 320 is excessively deformed and thus plastic-deformed.

Further, it is also prevented that the piezoelectric element 340 coupled to the vibrating plate 320 is excessively deformed together with the vibrating plate 320 and then damaged.

If necessary, the vibrating plate 320 and the support part 312 may be formed to have the same thickness, and the vibrating plate 320 may be formed of a material which is stronger than a material of the support part 312 so that the support part 312 is more deformed.

Meanwhile, in the third embodiment, the support part 312 is characterized by the configuration as shown in FIG. 13, but the support part 312 may have various configurations in order to elastically support the vibrating plate 320.

The cover 313 is coupled to the base 311 so as to cover an upper portion of the base 311.

The case 310 is formed with a hooking groove 314 for restricting up/down moving distance of a hooking protrusion 333 formed at the vibrating plate 320.

Detailedly, as shown in FIGS. 11 and 12, a recessed groove 314a is formed downward at an upper end of a side surface of the base 311, and the cover 313 is formed with a protrusion 314b which is inserted into the recessed groove 314a formed at the base 311, and thus the hooking groove 314 is formed between the base 311 and the cover 313 which are coupled to each other.

The hooking protrusion 333 is inserted into the hooking groove 314.

An up/down spacing distance of the hooking groove 314 is longer than an up/down thickness of the hooking protrusion 333 so that the hooking protrusion 333 can be moved up and down in the hooking groove 314, and an up/down moving distance of the hooking protrusion 333 is restricted by the hooking groove 314.

The detailed description thereof will be described later together with the hooking protrusion 333.

Meanwhile, the case 310 may be formed with a separate protrusion which is formed inwardly so as to restrict the up/down movement of the hooking protrusion 333 without the hooking groove 314. However, in the third embodiment, the case 310 is formed with the hooking groove 314 so that the hooking protrusion 333 can be inserted therein, and thus it is possible to minimize a whole volume of the case 310.

Both ends of the vibrating part 320 are coupled to the support part 312 and disposed in the case 310.

The vibrating plate 320 is formed into a flat type, and has a thickness which is thicker than the support part 312, as described above.

Therefore, when the external impact is exerted, the support part 312 which is thinner than the vibrating plate 320 is deformed together with the vibrating plate 320 so as to reduce the bending deformation of the vibrating plate 320, and thus it is prevented that the vibrating plate 320 is excessively deformed over the elastic limit.

And the vibrating plate 320 on which the piezoelectric element 340 is installed is deformed and vibrated together with the piezoelectric element 340.

The weight body 330 is coupled to a lower side of the vibrating plate 320 so as to be vibrated together with the vibrating plate 320.

The weight body 330 includes a weight part 331 and a connector 332.

The weight part 331 is formed of tungsten and coupled to the lower side of the vibrating through the connector 332.

Tungsten has a specific gravity of 14 to 19.5 which is larger than iron having a specific gravity of 7 to 8 and other metals.

Therefore, since the weight part 331 is formed of tungsten having a large specific gravity, it is possible to increase a mass of the vibrating plate 320 without increasing a volume of the weight part 331 and also reduce a volume thereof, even though having the same mass.

If the mass of the weight part 331 is increased, the resonant frequency of the vibrating plate 320 including the weight part 331 becomes small, and thus it is *facile* to increase the vibration power due to the resonant phenomenon when the vibrating plate 320 is vibrated by the piezoelectric element 340.

The connector 332 allows the weight part 331 to be coupled to the vibrating plate 320. The connector 332 is integrally formed with the hooking protrusion 333.

The connector 332 may be integrally formed with the weight part 331 so as to be coupled to the vibrating plate 320, but since it is difficult to machine the weight part 331 formed with tungsten, the connector 332 is formed of a soft material, which can be facilely machined, so as to couple the weight part 331 and the vibrating plate 320.

As described above, the hooking protrusion 333 is formed to be protruded laterally and then inserted into the hooking groove 314. And as shown in FIG. 14, the hooking protrusion 333 is contacted with an upper or lower surface of the hooking groove 314 so that the up/down moving distance thereof is restricted.

And as shown in FIG. 14, in the state that the external impact is not exerted or the power is not applied to the piezoelectric element 340, a distance between the hooking protrusion 333 and the upper surface of the hooking groove 314 is shorter than that between the piezoelectric element 340 and the cover 313, and a distance between the hooking protrusion 333 and the lower surface of the hooking groove 314 is shorter than a distance between the weight part 331 and the base 311.

As described above, since the hooking protrusion 333 is inserted in the hooking groove 314 so that the up/down moving distance thereof is restricted, it is prevented that the vibrating plate 320 is excessively deformed and thus plastic-deformed by strong external impact, thereby improving impact resistance.

Particularly, even in a falling test in which a product is free-fallen in order to perform an impact test of the product, the vibrating plate 320 is not plastic-deformed by the impact but can be normally operated.

Therefore, the present invention has a strong characteristic against the external impact even in an ordinary usage environment such as a mobile terminal equipped with the vibrator as described above.

Furthermore, since the up/down moving distance of the hooking protrusion 333 is restricted, the excessive deformation of the piezoelectric element 340 coupled to the vibrating part 320 is also restricted, and thus the damage of the piezoelectric element 340 is prevented.

Since the deformation quantity of the piezoelectric element 340 is larger than that needed to vibrate the vibrating plate 320 because of the weight part 331 coupled to the vibrating plate 320, the piezoelectric element 340 may be damaged by increase in the vibration power thereof due to the weight part 331.

Therefore, as described above, the up/down moving distance of the vibrating plate 320 in which the piezoelectric element 340 is coupled is restricted by the hooking protrusion 333, and thus the excessive deformation of the piezoelectric element 340 is prevented.

The piezoelectric element 340 is coupled to the vibrating part 320 so as to vibrate the vibrating plate 320 upward and downward when it is deformed to be bent.

More detailedly, the piezoelectric element 340 is surface-contacted to the vibrating plate 320 and deformed to be bent when the power is applied.

And the vibrating plate 320 is vibrated upward and downward by the bending deformation of the piezoelectric element 230.

If the vibrating plate 320 is vibrated upward and downward, the support part 312 in which the vibrating plate 320 is coupled is deformed to be bent and thus vibrated upward and downward.

That is, since the vertical part and horizontal part are deformed to be bent upward and downward and thus the vibrating plate 320 is vibrated, a total up/down displacement of the vibrating plate 320 can be maintained constantly, even though the bending deformation quantity of the vibrating plate 320 and piezoelectric element 340 are reduced.

Herein, if the weight part 331 is vibrated together and the vibration frequency generated by the piezoelectric element 340 is coincided with the natural frequency of the vibrating plate 320 including the weight part 331, the vibration power is increased by the resonant phenomenon.

And as described above, since the weight part 331 is formed of tungsten which has a larger specific gravity than other materials, the natural frequency of the vibrating plate 320 including the weight part 331 becomes small, and thus the vibration power thereof can be increased or the power consumption thereof can be reduced.

As the vibration power of the vibrating plate 320 is increased, the deformation quantity of the piezoelectric element 340 is increased.

Therefore, since the hooking protrusion 333 which is vibrated together with the vibrating plate 320 is inserted into the hooking groove 314 so that the up/down moving distance thereof is restricted, the deformation quantity of the piezoelectric element 340 is restricted, and thus it is prevented that the piezoelectric element 340 is damaged by the excessive deformation.

The piezoelectric element 340 may be divided into two parts and then arranged to be mutually spaced apart from a center portion of the vibrating plate 320.

Since the center portion of the vibrating plate 320 is deformed the most when the vibrating plate 320 is vibrated, the piezoelectric element 340 is disposed to be spaced apart from the center portion of the vibrating plate 320, thereby preventing the damage thereof due to the excessive deformation.

Further, a damper may be coupled to an upper portion of the vibrating plate 320 and a lower portion of the weight part 331 in order to absorb and reduce impact generated when the vibrating plate 320 is vibrated upward and downward.

Hereinafter, the operation process of the present invention as described above will be described.

FIG. 13 shows an initial state that the power is not yet applied to the piezoelectric element 340, wherein the piezoelectric element 340 and the vibrating plate 320 are not deformed.

In such state, if the power is applied to the piezoelectric element 340, the bending deformation of the piezoelectric element 340 is occurred, and the vibrating part 320 is vibrated up and down by the piezoelectric element 340.

If the piezoelectric element 340 is deformed to be bent upward, the vibrating plate 340 is also deformed together with the piezoelectric element 340, and each of the third horizontal part 312*f*, first vertical part 312*a*, first horizontal part 312*b*, second vertical part 312*c*, second horizontal part 312*d* and third vertical part 312*e* is deformed, and thus the vibrating plate 320 is vibrated up and down.

Since the support part 312 is thinner than the vibrating plate 320, it can be facilely vibrated up and down while being deformed together with the vibrating plate 320.

As described above, if the vibration frequency of the piezoelectric element 340 is coincided with the natural frequency of the vibrating plate 320 including the weight part 331, the resonant phenomenon is occurred, and thus the amplitude of the vibrating plate 320 vibrated by the piezoelectric element 340 is maximized and the vibration power thereof is also increased.

Therefore, it is possible to increase the vibration power of the vibrating plate 320 while reducing the power consumption.

Meanwhile, if the strong impact is occurred by user's carelessness or the like, the external force exceeding the elastic limit is exerted to the vibrating plate 320, and the vibrating plate 320 may be plastic-deformed.

Herein, as shown in FIG. 14, since the up/down moving distance of the vibrating plate 320 is restricted by the hooking protrusion 333, it is prevented that the vibrating plate 320 is excessively deformed and thus plastic-deformed.

Further, when the vibrating plate 320 is vibrated up and down by the external impact, the support part 312 which is thinner than the vibrating plate 320 is deformed together so as to reduce the bending deformation of the vibrating plate 320, and thus it is possible to prevent the excessive deformation of the vibrating plate 320 and the damage of the piezoelectric element 340.

The vibrator equipped with the piezoelectric element of the present invention has effects, as follows:

While the vibration member in which the vibration is substantially generated has a long length in order to generate the more enhanced vibration, the space occupied by the electronic unit is reduced, and also while the vibration power is increased, the power consumption is small, and thus it advantageous to reduce a size of the electronic unit.

Since the vibrating part to which the piezoelectric element is coupled is formed with the hooking protrusion so as to restrict the up/down and lateral moving distance thereof, it is possible to prevent the excessive deformation and plastic deformation of the vibrating part when the strong external impact is exerted, thereby improving the impact resistance.

Further, since the vibrating part to which the piezoelectric element is coupled is formed with the hooking protrusion so as to restrict the up/down and lateral moving distance thereof, the excessive deformation of the piezoelectric element is restricted and thus the damage thereof is also prevented.

And since the weight body formed of tungsten having a large specific gravity is coupled to the lower portion of the vibrating plate, it is possible to be coincided with the resonant frequency of the vibrating part, thereby reducing the power consumption and increasing the vibration power.

Further, since the two piezoelectric elements are arranged to be mutually spaced apart from the center portion of the vibrating plate, it is prevented that the piezoelectric element is excessively deformed by the center portion of the vibrating plate in which the maximum deformation is occurred.

Further, since the first and second dampers are coupled to the upper side of the vibrating part and the lower side of the weight part so as to be contacted with the base and cover when the vibrating part is vibrated, it is possible to absorb and reduce the impact generated when the vibrating part is vibrated.

Further, since the vibrating plate is elastically supported by the support part protruded from the base so that the support part is deformed together with the vibrating plate so as to reduce the bending deformation of the vibrating plate when the external impact is generated, it is prevented that the vibrating plate is excessively deformed and thus plastic-deformed by the strong external impact, thereby improving impact resistance.

Further, since the support part is thinner than the vibrating plate so as to be more deformed when the strong external impact, such that the vibrating plate is vibrated up and down, it is possible to prevent the excessive deformation of the vibrating plate and the damage of the piezoelectric element.

Further, since the weight part from which the hooking protrusion is formed is coupled to the vibrating plate in which the piezoelectric element is coupled and thus the up/down moving distance of the vibrating plate is restricted, the excessive deformation of the piezoelectric element is restricted and thus the damage of the piezoelectric element is prevented.

While the present invention has been described with respect to the specific embodiments, it will be apparent to those skilled in the art that various changes and modifications may be made without departing from the spirit and scope of the invention as defined in the following claims.

What is claimed is:

1. A vibrator equipped with a piezoelectric element, comprising:
 a case of which an upper or lower surface is configured to be coupled to an object to be vibrated;
 a vibrating part which is disposed in the case;
 a piezoelectric element which is coupled to the vibrating part so as to be deformed, thereby vibrating the vibrating part up and down; and
 a power supply part which supplies power to the piezoelectric element,
 wherein the vibrating part includes a hooking protrusion which is protruded laterally, and the case includes a hooking groove which restricts an up/down and lateral moving distance of the hooking protrusion.

2. The vibrator according to claim 1, wherein the hooking groove is disposed in a side surface of the case so that the hooking protrusion is inserted therein, and an up/down spacing distance of the hooking groove is larger than an up/down thickness of the hooking protrusion, and the hooking protrusion is contacted with an upper or lower surface of the hooking groove so that up/down and lateral movement thereof is restricted.

3. The vibrator according to claim 1, wherein the vibrating part comprises a vibrating flat plate having both ends bent downward so as to be coupled to the case and on which the piezoelectric element is disposed so as to vibrate the vibrating flat plate; and a weight body from which the hooking protrusion is protruded and which is coupled to a lower side of the vibrating flat plate so as to be vibrated together with the vibrating flat plate, and deformation of the piezoelectric element is restricted by the hooking protrusion.

4. The vibrator according to claim 3, wherein the weight body comprises a weight part and a connector which couples the weight part and the vibrating flat plate, and the hooking protrusion is integrally formed with the connector, and the weight part is formed of tungsten.

5. The vibrator according to claim 3, wherein the piezoelectric element is divided into two parts and disposed on the vibrating flat plate, and the two piezoelectric elements are arranged to be mutually spaced apart from a center portion of the vibrating flat plate.

6. The vibrator according to claim 5, further comprising a first damper which is coupled to an upper portion of the vibrating flat plate and disposed between the two piezoelectric elements; and a second damper which is coupled to a lower portion of the weight body.

\* \* \* \* \*